United States Patent
Hainz et al.

(10) Patent No.: US 10,250,241 B2
(45) Date of Patent: Apr. 2, 2019

(54) ASYNCHRONOUS OUTPUT PROTOCOL

(71) Applicant: Infineon Technologies AG, Neubiberg (DE)

(72) Inventors: Simon Hainz, Villach (IT); Theodor Kranz, Sirnitz (AT); Hubert Fischer, Moosburg (AT); Tobias Werth, Villach (IT)

(73) Assignee: Infineon Technologies AG, Neubiberg (DE)

( * ) Notice: Subject to any disclaimer, the term of this patent is extended or adjusted under 35 U.S.C. 154(b) by 498 days.

(21) Appl. No.: 14/597,741

(22) Filed: Jan. 15, 2015

(65) Prior Publication Data

US 2016/0211837 A1    Jul. 21, 2016

(51) Int. Cl.
*H03K 5/15* (2006.01)
*G01P 3/487* (2006.01)
*G01R 19/175* (2006.01)

(52) U.S. Cl.
CPC .............. *H03K 5/15* (2013.01); *G01P 3/487* (2013.01); *G01R 19/175* (2013.01)

(58) Field of Classification Search
CPC .. H03K 5/00; H03K 5/01; H03K 5/04; H03K 5/05; H03K 5/06; H03K 5/065
USPC ........................................................ 327/184
See application file for complete search history.

(56) References Cited

U.S. PATENT DOCUMENTS

| 4,398,154 A * | 8/1983 | Lee .......................... H03K 5/06 327/172 |
| 4,563,741 A * | 1/1986 | Matsumura ........... F02D 41/009 327/116 |
| 4,584,528 A | 4/1986 | Ohmae et al. |
| 5,388,087 A * | 2/1995 | Saiki ...................... G11B 7/005 369/124.04 |
| 2016/0028379 A1* | 1/2016 | Tsubota ................. H03K 3/012 327/291 |

FOREIGN PATENT DOCUMENTS

| CN | 87100273 A | 7/1987 |
| CN | 101147041 A | 3/2008 |
| CN | 103575303 A | 2/2014 |
| CN | 103748473 A | 4/2014 |

OTHER PUBLICATIONS

Office Action dated Dec. 4, 2017 for Chinese Patent Application No. 201610025853.X.

* cited by examiner

*Primary Examiner* — Lincoln D Donovan
*Assistant Examiner* — Diana J. Cheng
(74) *Attorney, Agent, or Firm* — Schiff Hardin LLP

(57) ABSTRACT

An apparatus and corresponding method for outputting a protocol pulse based on a speed signal representing speed of an object. The apparatus includes a zero-crossing circuit, and a delay circuit. The zero-crossing circuit is configured to output the protocol pulse at a zero-crossing of the speed signal. The delay circuit is coupled to the output of the zero-crossing circuit and configured to delay the protocol pulse. A first edge of the protocol pulse is asynchronous with a clock, and a second edge of the protocol pulse is synchronous with the clock.

22 Claims, 4 Drawing Sheets

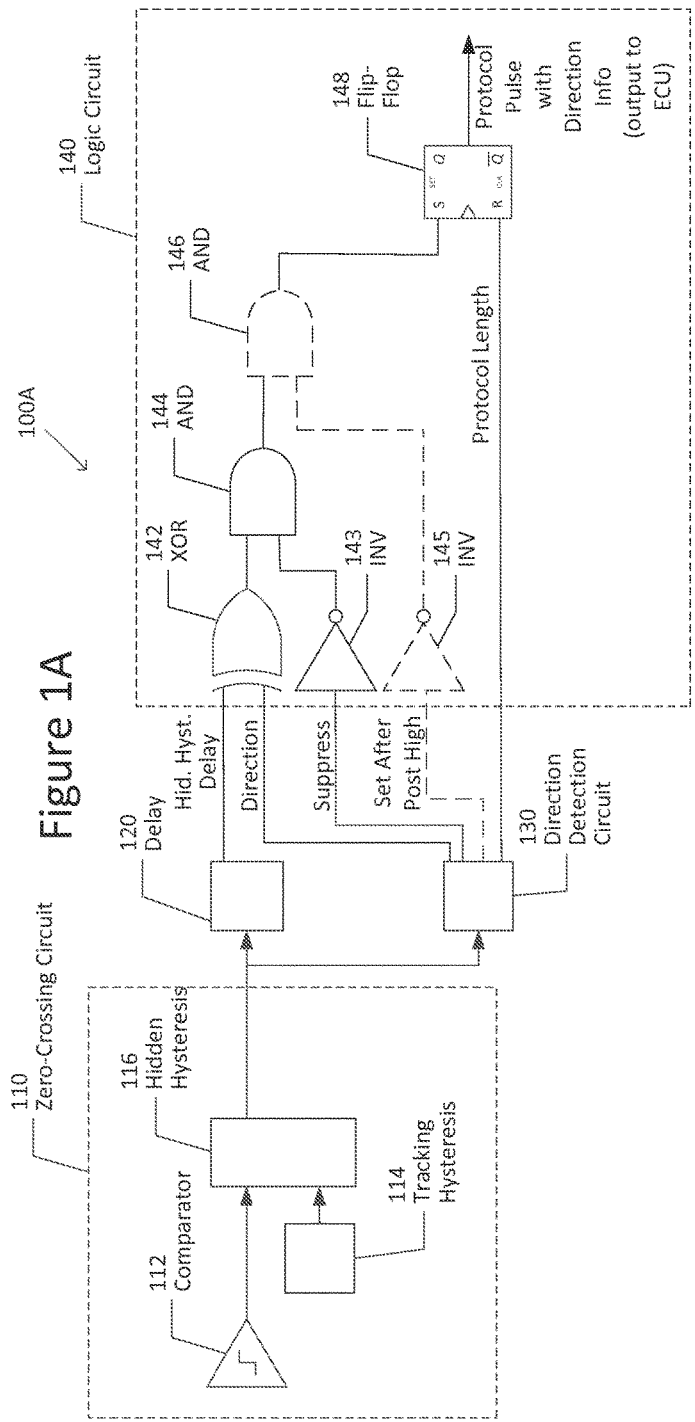
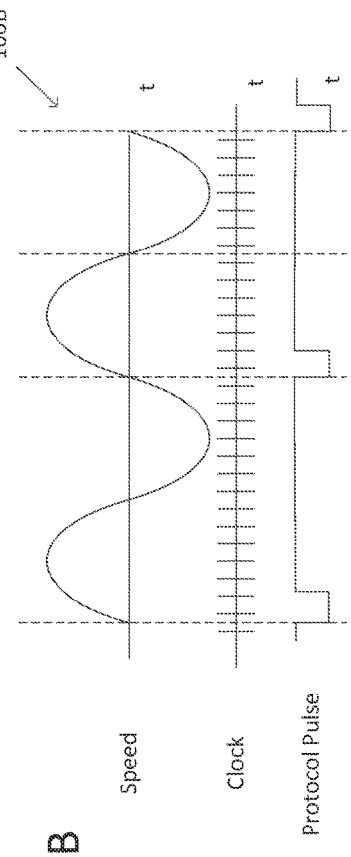
Figure 1A
Figure 1B

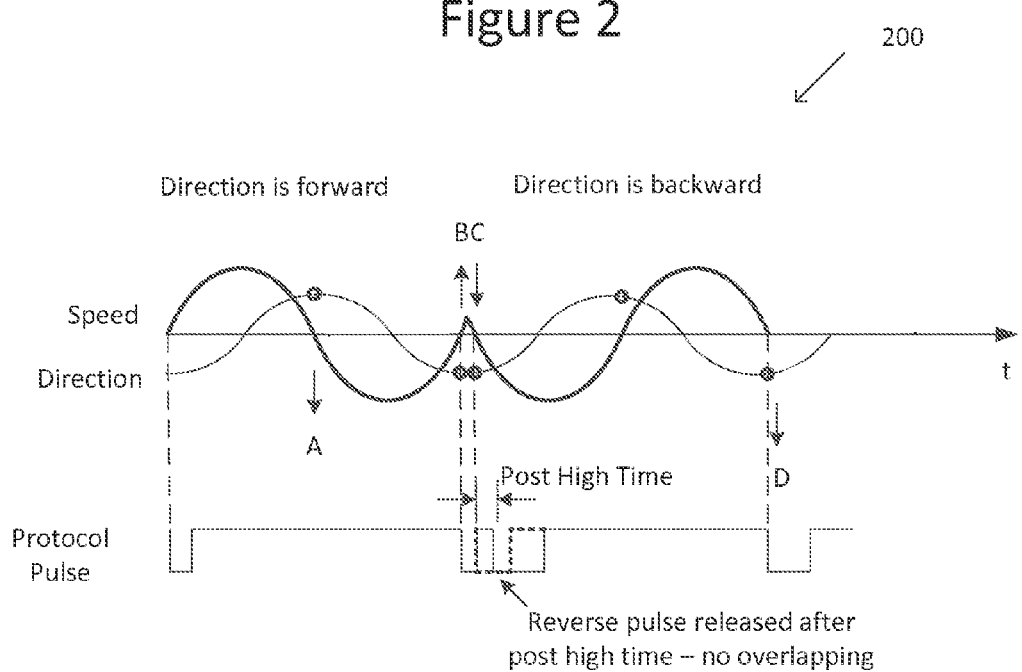
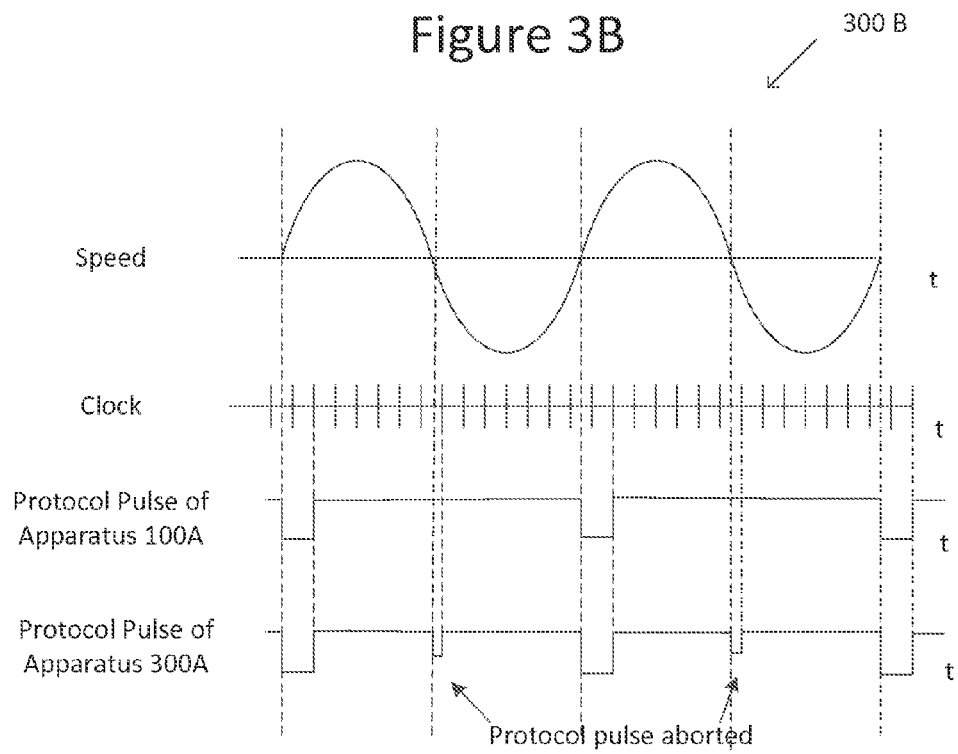

ASYNCHRONOUS OUTPUT PROTOCOL

BACKGROUND

A crankshaft position detector operates based on protocol pulse detection and counting. The protocol pulses are transmitted to an Electronic Control Unit (ECU) to control, for example, ignition timing and fuel injection timing of a vehicle.

The detector may include a toothed disc mounted on a shaft, stationary sensors and circuitry. The disc has teeth distributed evenly around the circumference. When the shaft rotates, the teeth pass by magnetic sensors providing speed and direction information. The speed is represented by a sine wave, and the direction is represented by a cosine wave. If there is a zero-crossing of the sine wave (speed signal), the cosine wave (direction signal) is sampled to determine the object's direction. A zero-crossing is a point when a sign of the wave changes, e.g., from positive to negative, represented by a crossing of the axis in the graph of the wave.

In crankshaft applications, a forward protocol pulse is triggered on the falling edge of the speed signal, and a backward protocol pulse is triggered on the rising edge of the speed signal. The direction information of the crankshaft should therefore be known prior to the protocol pulse being triggered.

BRIEF DESCRIPTION OF THE DRAWINGS

FIG. 1A is a circuit diagram illustrating an apparatus for outputting a protocol pulse in accordance with an exemplary embodiment.

FIG. 1B is a graph illustrating speed/clock/protocol pulses versus time.

FIG. 2 is a graph illustrating speed/direction/protocol pulses versus time.

FIG. 3B is a graph illustrating speed/clock/protocol pulses versus time.

DETAILED DESCRIPTION

Figure 3A:
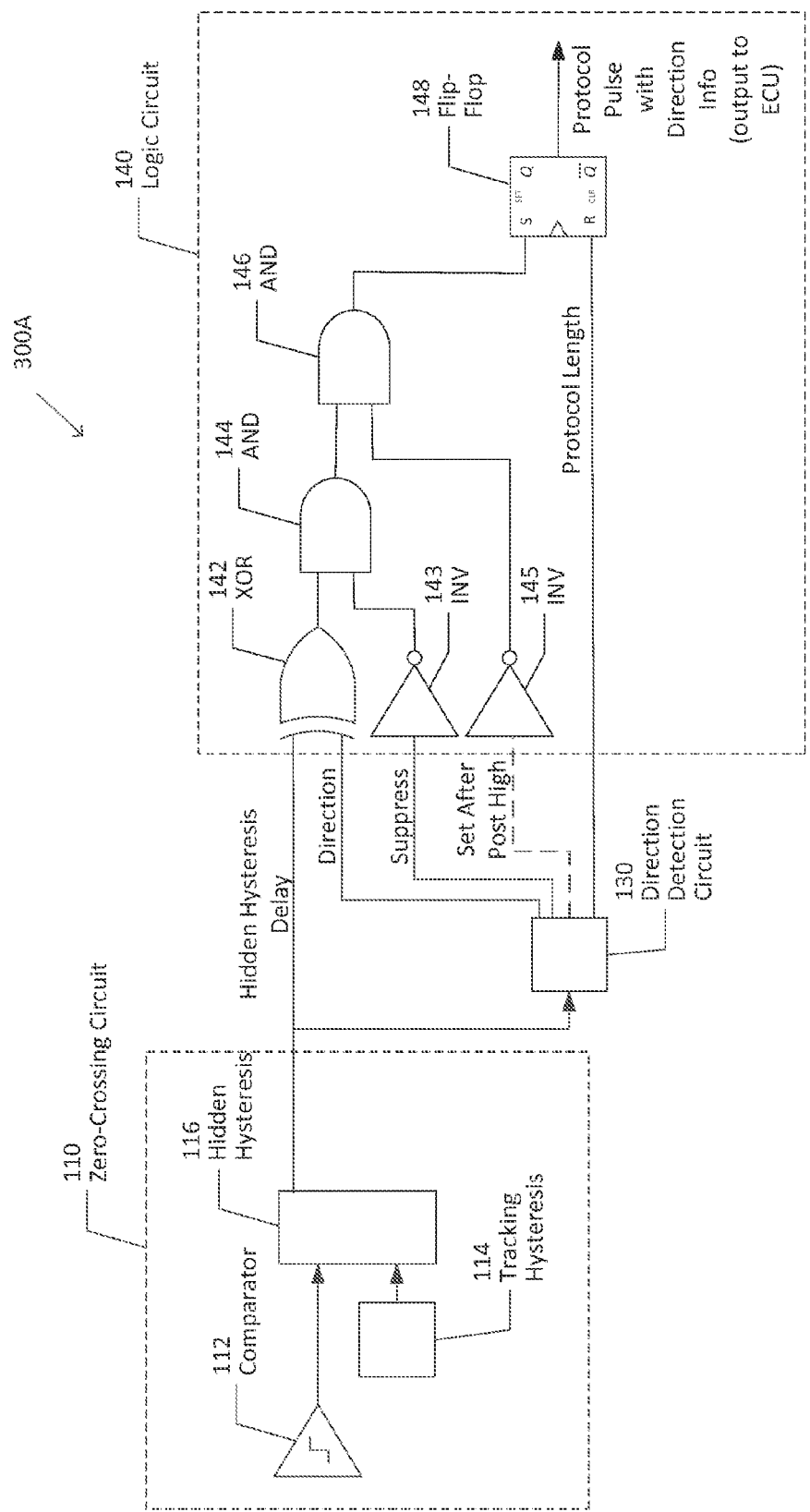
FIG. 3A is a circuit diagram illustrating an apparatus for outputting a protocol pulse in accordance with another exemplary embodiment.

The present disclosure is directed to an apparatus and method for determining a speed of an object and triggering a corresponding protocol pulse asynchronously. The protocol pulse is triggered asynchronously and released synchronously with a clock. This combination of asynchronous and synchronous switching makes it possible to achieve asynchronous low jitter switching even with a clock cycle having a low frequency.

FIG. 1A is a circuit diagram illustrating an apparatus 100A for outputting a protocol pulse in accordance with an exemplary embodiment. FIG. 1B is a graph 100B illustrating speed/clock/protocol pulses versus time.

The apparatus 100A is configured to generate a protocol pulse based on a speed and direction of an object. The object may be, for example, a rotating object, or alternatively a linearly moving object. It is convenient for the moving object to show a varying magnetization or varying magnetic properties. Such varying magnetization or magnetic properties may be, for example, achieved by a wheel or target made of a soft magnetic material, in particular for a rotating object. For the linearly moving object, varying magnetization or magnetic properties may be provided along the direction of movement, for example, for a linear arrangement comprising teeth made from a soft magnetic material as explained above. The speed of the object may be detected using a magnetic field sensor arranged at a distance from the object. The direction may be clockwise (forward) or counterclockwise (reverse).

By way of overview, the apparatus 100A includes a zero crossing circuit 110, a delay circuit 120, a direction detection circuit 130, and a logic circuit 140. The zero-crossing circuit 110 is configured to trigger the protocol pulse asynchronously at a zero-crossing of the speed signal. The direction detection circuit 130, in response to receiving the triggered protocol pulse, detects a direction of the object and outputs one or more corresponding control signals. Since it takes time for the direction detection circuit 130 to determine the object direction, a delay circuit 120 is coupled in parallel with the direction detection circuit 130, and delays the triggered protocol pulse. The logic circuit 140, based on the one or more control signals, determines whether the protocol pulse is suppressed, or alternatively, is output to the ECU (not shown). The logic circuit 140 also determines the protocol pulse's length. The protocol pulse frequency corresponds with the object's speed, and the protocol pulse length corresponds with the object's direction. Also, a protocol pulse length could be defined to indicate a safety warning if an internal Built-In Self Test (BIST) detects a problem, such as a malfunction of the sensor. A more detailed explanation of the circuit elements follows.

The zero-crossing circuit 110 is configured to output the protocol pulse at a zero-crossing of the speed signal. A first edge of the protocol pulse is thus asynchronous with a clock. This first edge may be a falling edge in a case of the apparatus 100A having open drain transistors, or a rising edge with open source transistors, The zero-crossing circuit 110 includes a comparator 112, a tracking hysteresis circuit 112, and a hidden hysteresis circuit 116. The comparator 112 is configured to output a protocol pulse at the zero-crossing of the speed signal. Noise may cause the speed signal to cross the zero-crossing multiple times when it should cross only once. The tracking hysteresis circuit 114 and the hidden hysteresis circuit 116 together remove this noise. The tracking hysteresis circuit 114 may be a Schmitt trigger. As is known, a Schmitt trigger's output retains its value until the input changes sufficiently to trigger a change. When the input is higher than a predefined threshold, the output is high. When the input is below a lower predefined threshold, the output is low, and when the input is between the two levels, the output remains the same. This dual threshold action is called hysteresis. The hidden hysteresis circuit 116 is configured to permit the output state to change only if the tracking hysteresis circuit signal exceeds the hysteresis levels, that is, the Schmitt trigger levels.

The direction detection circuit 130 is configured to detect the direction of the object—forward (clockwise) or reverse (backward). The direction detection is started in response to the direction detection circuit 130 receiving the protocol pulse from the comparator 112. After the direction detection circuit 130 detects the direction, it outputs one or more corresponding control signals—suppress, set after post high, and/or protocol length.

FIG. 2 is a graph 200 illustrating speed/direction/protocol pulses versus time. The speed of the object is represented by a sine wave, shown as a bold line, and the direction by a cosine wave, shown as a shallow line. At a zero crossing of the sine wave (speed signal), that is, at a switching of the comparator 110, the cosine wave (direction signal) is sampled to determine the object's direction. The direction detection is based on a difference between last and actual amplitude values of the sampled direction signal. The difference of the amplitude values of |point A-point B| and |point C-point B| indicates a change of direction.

The direction detection circuit 130 is configured to output, based on the detected direction of the object, one or more control signals. These control signals may include a suppress control signal, an optional set after post-high control signal (or in a case of open source transistors, set after post-low signal), and/or a protocol length signal. A more detailed discussion of these control signals is provided below with respect to the description of the logic circuit 140.

The delay circuit 120 is coupled in parallel with the direction detection circuit 130 and is configured to delay the protocol pulse. It takes time for the direction detection circuit 130 to determine the object's direction. Due to the delay, the direction detection circuit 130 can detect the direction information before the protocol pulse is output or suppressed. The amount of the delay may be any amount suitable to the circuit design, but is generally greater than or equal to two clock cycles, enough time to allow the object's speed and direction to be detected. For example, the delay may be in a range of 2.5 μs to 11 μsec.

The logic circuit 140 is coupled to the output of the delay circuit 120 and also to the output of the direction detection circuit 130. The logic circuit 140 includes an XOR gate 142, an inverter 143, an AND gate 144, an optional inverter 145, an optional AND gate 146, and a flip-flop 148. Based on the one or more control signals output by the direction detection circuit 130, the logic circuit 140 dictates whether the protocol circuit is suppressed or output. The logic circuit 140 also dictates the protocol pulse's length. Suppression of the protocol pulse is determined based on the object's detected direction during a rising and/or falling edge of the speed signal.

In crankshaft applications it is common to transmit a protocol pulse on the rising edge of the speed signal when the direction is detected as clockwise (forward), and on the falling edge of the speed signal when the direction is detected as counterclockwise (backward). Otherwise, the protocol pulse is suppressed. One protocol pulse should be transmitted for each sine wave (speed signal) cycle representing one rotation of the crankshaft if there are 60 periods during one rotation, for example. If the protocol pulses were to be transmitted to the ECU at both the falling and rising edges of the speed signal, then there would be double the number of protocol pulses, which the ECU would interpret as the crankshaft having twice its actual speed.

The suppression of the protocol pulse is controlled by the AND gate 144, which has a first input coupled to an output of the XOR gate 142 and a second input coupled to an output of the direction detection circuit 130; the XOR gate 142 has a first input coupled to the output of the delay circuit 120 and a second input coupled to the output of the direction detection circuit 130. It is to be noted for the implementation shown in FIG. 1A, the second input of the AND gate 144 is being inverted by an inverter 143. In response to receiving a suppress control signal, the AND gate 144 causes the protocol pulse to be suppressed, that is, the AND gate 144 prevents the protocol pulse from being transmitted from the delay circuit 120 to the flip-flop 148. Otherwise, the AND gate 144 outputs the protocol pulse.

The length of the protocol pulse is dependent on the detected direction of the object. For example, when the crankshaft is moving in the clockwise (forward) direction the protocol pulse length may be 45 μs, and when moving in the counterclockwise (backward) direction the protocol pulse length may be 90 μs, though the disclosure is not limited in this respect. The protocol length control signal is used by the logic circuit 140 to end the protocol pulse after the prescribed time period.

The length of the protocol pulse is determined by the flip-flop 148, which has a set input coupled to the output of the AND gate 144 and a reset input coupled to the output of the direction detection circuit 130. The flip-flop 148 is reset in response to receiving at its reset the protocol pulse length control signal. Since the direction detection circuit 130 is a digital element synchronized with the clock, the protocol length control signal is also synchronized with the clock, thereby ending the protocol pulse synchronously with the clock.

Overlapping protocol pulses could occur if two protocol pulses are too close in time, such as when there is a change of direction (e.g., forward then backward within 45 μsecs of the forward protocol pulse). See FIG. 2, the portion of the graph 200 showing a change of direction. The dashed pulse represents a backward protocol pulse that, if permitted to be transmitted, would overlap the forward protocol pulse and end up resulting in a misinterpretation by the ECU of the crankshaft speed and direction. If the difference between the direction samples at the zero speed crossing is small compared with a last signal amplitude peak-to-peak, a direction change is assumed.

Optionally, this overlapping can be prevented if, for a predetermined period of time following a protocol pulse, the logic circuit 140 suppresses a subsequently generated protocol pulse; but then following the predetermined period of time, the logic circuit 140 outputs the subsequent protocol pulse synchronously with a first rising clock edge. For example, the backward protocol pulse closely following the forward pulse is not triggered, and instead the forward protocol pulse continues for it designated time period (e.g., 45 μsec). Then there is a waiting period for the backward designated time period (e.g., 90 μsec), and then the direction detection circuit 130 triggers a backward protocol. This backward protocol pulse is not triggered by the magnetic field, but is instead triggered by the optional set after post-high control signal transmitted by the direction detection circuit 130 to the optional AND gate 146. This AND gate 146 is coupled between the AND gate 144 and the flip-flop 148. The AND gate's 146 first input is coupled to the output of the AND gate 144, the second input is coupled to the output of the direction detection circuit 130 via the inverter 145, and the output is coupled to the set input of the flip-flop 148. In response to the AND gate 146 receiving the set after post high control signal, the AND gate 146 outputs a protocol pulse to the set input of the flip flop 148 to be output to the ECU. The number of protocol pulses ends up being correct as the backward protocol pulse is not lost.

In the apparatus 100A of FIG. 1A, the analog components are the comparator 112, tracking circuit 114, hidden hysteresis circuit 116, delay circuit 120, XOR gate 142, inverter 143, AND gate 144, inverter 145, AND gate 146, and flip-flop 148. All of the components are analog with the exception of the direction detection circuit 130. The flip-flop 148 is a digital element that is not synchronized to a clock. The direction detection circuit 130 is the only element synchronized with the clock. The three output control signals (suppress, set after post-high, and protocol length) are synchronized with the clock and allow the asynchronous signal from the analog components to trigger or suppress the protocol pulse. The disclosure is not limited to the components being analog and digital as described in this paragraph. Each of the components may be analog or digital as suitable for a particular application.

FIG. 3A is a circuit diagram illustrating an apparatus 300A for outputting a protocol pulse in accordance with another exemplary embodiment. FIG. 3B is a graph illustrating speed/clock/protocol pulse of apparatus 100A/protocol pulse of apparatus 300A versus time.

Apparatus 300A of FIG. 3A is similar to apparatus 100A of FIG. 1A, except that there is no delay circuit 120. The protocol pulse is triggered on both the rising and falling zero-crossings of the speed signal. Subsequently, such as two clock cycles later, when the direction information is available, any unwanted protocol pulses are aborted. More specifically, the protocol pulses are triggered at the rising edge zero-crossings of the speed signal with pulse length of 45 μsec, for example. And in addition, as shown in FIG. 3B, there are pulses between these protocol pulses, so the flip-flop 148 would still be set. But after two clock cycles the apparatus 300A recognizes based on the detected direction that this pulse should not be a protocol pulse, and the pulse is aborted by the direction detecting circuit 130 transmitting the protocol length control signal to reset the flip-flop 148 to terminate the pulse. With a certain slew rate of the output protocol, the aborted protocol pulse would not be interpreted as an additional protocol pulse.

Apparatus 100A of FIG. 1A and apparatus 300A of FIG. 3A are designed using open drain transistors, so a first edge of a protocol pulse is a falling edge and a second edge is a rising edge. Alternatively, apparatus 100A and apparatus 300A may be designed using open source transistors, such that a first edge of a protocol pulse would be a rising edge and a second edge would be a falling edge. Of course the disclosure is not limited to MOSFET transistors, but may be designed with alternative circuit elements, such as BJTs, as suitable for the intended purpose.

In FIG. 3B, the rising portions of the respective protocol pulse edges may be synchronized to a clock event of the system, for example, to a clock of a digital core of the sensor system. However, the disclosure is not limited to such a synchronism. Further, it is understood by a person of skill how to synchronize protocol pulse edges with a clock event, so for the sake of brevity, a detailed description is not included here.

Further, within this disclosure synchronicity is described with regard to rising protocol pulse edges for an open drain transistor protocol. Without limitation the synchronicity may be established with regard to falling protocol pulse edges in the context of a current interface as a non-limiting example, depending on the circumstances and applications.

Within this disclosure asynchronous protocol pulse edges are described with regard to falling protocol pulse edges for an open drain protocol. Without limitation the asynchronous protocol pulse edges may be established with regard to rising protocol pulse edges in the context of a current interface as a non-limiting example, depending on the circumstances and applications.

FIG. 3B shows the rising protocol pulse edges in synchronicity with a first clock event following the falling (asynchronous) protocol pulse edge for aborted protocol pulses and in synchronicity with the second clock event following the falling asynchronous protocol pulse edge for valid protocol pulses. Without limitation the synchronicity between the rising protocol pulse edges and clock events following the falling protocol edge may be established with regards to second, third, fourth, or further clock events following the falling protocol edge, depending on the circumstances and applications. It may be convenient to choose a number of synchronous clock cycles representing aborted protocol pulses that are smaller than valid protocol pulses. In particular, it may be convenient to select the number of synchronous clock cycles representing aborted protocol pulses to be as small as one clock cycle.

Figure 4:
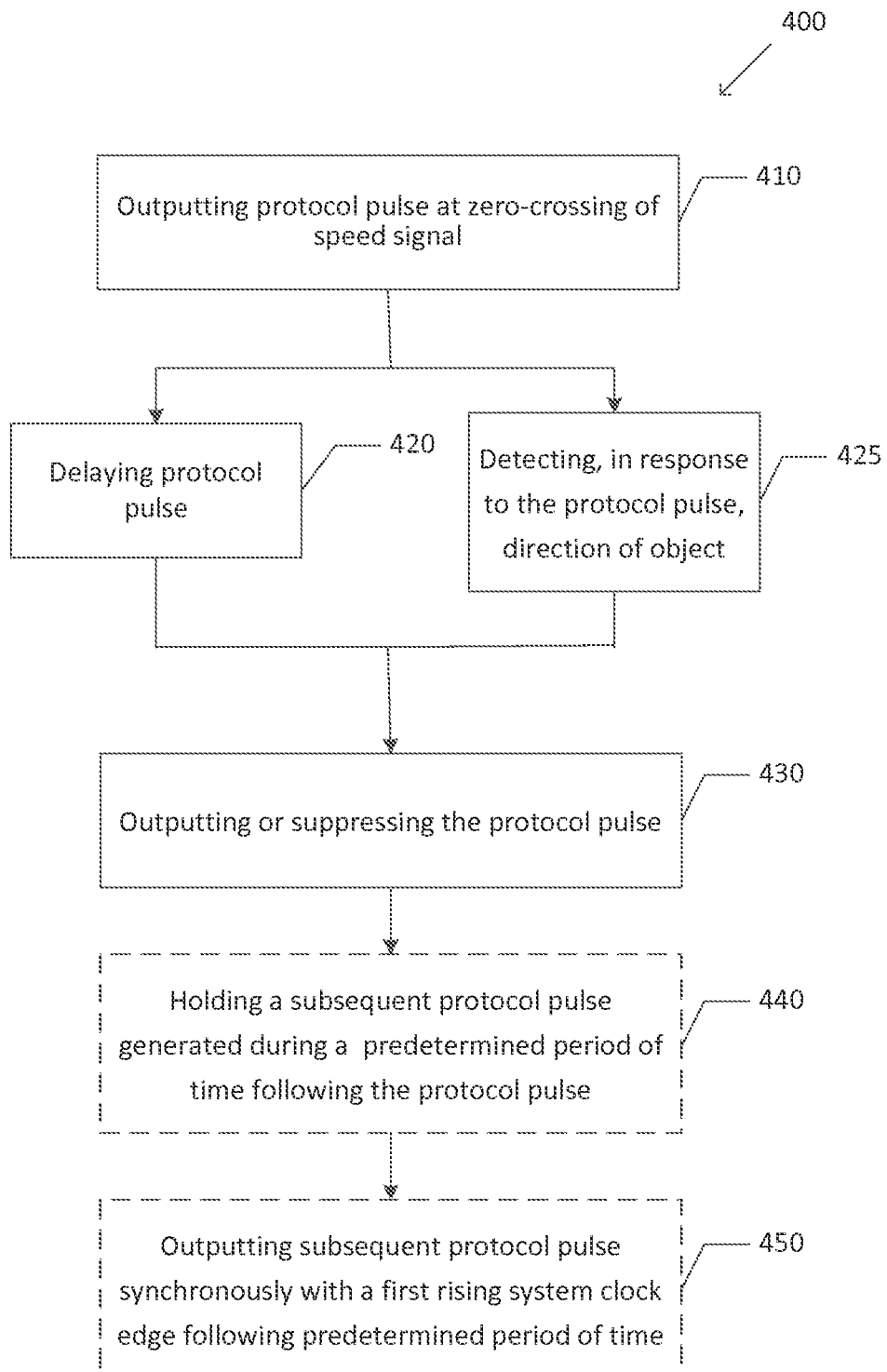
FIG. 4 is a flowchart illustrating a method for outputting a protocol pulse in accordance with an exemplary embodiment.

FIG. 4 is a flowchart 400 illustrating a method for outputting a protocol pulse in accordance with an exemplary embodiment.

At Step 410, a zero-crossing circuit 110 outputs a protocol pulse at a zero-crossing of an object's speed signal. A first edge of this protocol pulse is asynchronous with a clock.

At Step 425, a direction detection circuit 130, in response to receiving the protocol pulse output by the zero-crossing circuit 110, detects the direction of the object based on a direction signal. Simultaneously, at Step 420, the protocol pulse is delayed by a delay circuit 120 to allow time for the direction to be detected.

Next, at Step 430, a logic circuit 140 outputs or suppresses the protocol pulse based on the detected direction. A second edge of the protocol pulse is synchronous with the clock.

At optional Step 440, it is possible to during a predetermined period of time following the protocol pulse, hold any subsequent protocol pulse. And then, optionally at Step 450, output the subsequent protocol pulse synchronously with a first rising clock edge following the predetermined period of time.

The exemplary embodiments described herein involve a protocol pulse having an asynchronous first edge (triggered by the zero-crossing circuit 110 and delayed), and a synchronous second edge (triggered by the direction detection circuit 130). Pulse length indicates object direction. This combination of asynchronous and synchronous switching makes it possible to achieve the benefits of asynchronous low-jitter switching even with a low frequency clock.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. An apparatus for outputting a protocol pulse based on a speed signal representing speed of an object, the apparatus comprising:
    a zero-crossing circuit configured to output the protocol pulse at a zero-crossing or hysteresis crossing of the speed signal; and
    a delay circuit coupled to the output of the zero-crossing circuit and configured to delay the protocol pulse,
    wherein a first edge of the protocol pulse is asynchronous with a clock, and a second edge of the protocol pulse is synchronous with the clock.

2. The apparatus of claim 1,
    wherein the protocol pulse is also based on a direction signal representing direction of the object, and
    wherein the apparatus further comprises a direction detection circuit, coupled in parallel with the delay circuit, and configured to, in response to receiving the protocol pulse output by the zero-crossing circuit, detect based on the direction signal the direction of the object and output at least one corresponding control signal.

3. The apparatus of claim 2, further comprising:
a logic circuit coupled to the output of the delay circuit and to the output of the direction detection circuit, and configured to, based on the at least one control signal, one of suppress and output the protocol pulse.

4. The apparatus of claim 3, wherein the logic circuit is further configured to suppress the protocol pulse when the speed signal crosses zero with one of a rising and falling edge.

5. The apparatus of claim 4, wherein the logic circuit is further configured to suppress the protocol pulse when the speed signal crosses zero with a rising edge and the detected direction is backward or counterclockwise, and when the speed signal crosses zero with a falling edge and the detected direction is forward or clockwise.

6. The apparatus of claim 3, wherein the logic circuit is further configured to set a length of the protocol pulse based on the at least one control signal.

7. The apparatus of claim 6, wherein the length of the protocol pulse is dependent on the detected direction of the object.

8. The apparatus of claim 3, wherein the logic circuit is further configured to, for a predetermined period of time following a protocol pulse, suppress any subsequent protocol pulse.

9. The apparatus of claim 8, wherein if during the predetermined period of time a subsequent protocol pulse is generated, the logic circuit is further configured to output the subsequent protocol pulse synchronously with a first rising clock edge following the predetermined period of time.

10. The apparatus of claim 1, wherein the delay is greater than or equal to two clock cycles.

11. The apparatus of claim 1, wherein the object is a linear or rotating object with teeth comprising a soft magnetic material configured to create a varying magnetization, and the speed of the object is detected using a magnetic field sensor arranged a distance from the object.

12. The apparatus of claim 2,
wherein the at least one control signal comprises a suppress signal, and
wherein the logic circuit comprises:
a first AND gate having a first input coupled to an output of the delay circuit and a second input coupled to an output of the direction detection circuit, and configured to, in response to receiving the at least one control signal, suppress the protocol pulse received from the delay circuit.

13. The apparatus of claim 12, wherein the logic circuit further comprises:
an XOR gate coupled between the output of the delay circuit and the first input of the AND gate; and
an inverter coupled between the output of the direction detection circuit and the second input of the first AND gate.

14. The apparatus of claim 12,
wherein the at least one control signal further comprises a protocol pulse length signal, and
wherein the logic circuit further comprises a flip-flop having a set input coupled to an output of the first AND gate and a reset input coupled to the output of the direction detection circuit, and configured to be reset in response to the protocol pulse length signal received at the reset input, wherein the length of the protocol pulse is dependent on the detected direction of the object.

15. The apparatus of claim 14,
wherein the at least one control signal further comprises a set after post-high signal or a set after post-low signal, and
wherein the logic circuit further comprises a second AND gate having a first input coupled to the output of the first AND gate, a second input coupled to the output of the direction detection circuit and an output coupled to the set input of the flip-flop, and configured to, in response to receiving the set after post-high signal or the set after post-low signal, output a subsequent protocol pulse synchronously with a first rising clock edge after a predetermined period of time following the output of the protocol pulse.

16. An apparatus for outputting protocol pulses based on a speed signal representing speed of an object and on a direction signal representing direction of the object, the apparatus comprising:
a direction detection circuit configured to, in response to receiving each of the protocol pulses, detect based on the direction signal the respective directions of the object; and
a logic circuit coupled to the output of the direction detection circuit, and configured to, based on the detected directions of the object, one of abort and output each of the respective protocol pulses,
wherein a first edge of each of the protocol pulses is asynchronous with a clock, and a falling edge of each of the protocol pulses is synchronous with the clock.

17. A method for outputting a protocol pulse based on a speed signal representing speed of an object, the method comprising:
outputting, by a zero-crossing circuit, the protocol pulse at a zero-crossing or a hysteresis crossing of the speed signal,
wherein a first edge of the protocol pulse is asynchronous with a clock, and a second edge of the protocol pulse is synchronous with the clock.

18. The method of claim 17,
wherein the protocol pulses are further based on a direction signal representing direction of the object, and
the method further comprises:
detecting, by a direction detection circuit, in response to receiving the protocol pulse output by the zero-crossing circuit, the direction of the object based on the direction signal;
outputting at least one control signal corresponding to the detected direction of the object; and
one of outputting and suppressing, by a logic circuit and in response to the at least one control signal, the protocol pulse.

19. The method of claim 18, further comprising:
delaying, by a delay circuit, the protocol pulse during the detection of the direction of the object.

20. The method of claim 18, further comprising:
suppressing, by the logic circuit, the protocol pulse when the speed signal crosses zero with one of rising and falling edges.

21. The method of claim 18, further comprising:
setting, by the logic circuit, a length of the protocol pulse based on the at least one control signal, wherein the length of the protocol pulse is dependent on the detected direction of the object.

22. The method of claim 17, further comprising:
- suppressing, for a predetermined period of time following the protocol pulse, any subsequent protocol pulse; and
- if during the predetermined period of time a subsequent protocol pulse is generated,
  - holding the subsequent protocol pulse; and
  - outputting the subsequent protocol pulse synchronously with a first rising clock edge following the predetermined period of time.

\* \* \* \* \*